(12) United States Patent
Yang et al.

(10) Patent No.: US 10,674,599 B2
(45) Date of Patent: Jun. 2, 2020

(54) CIRCUIT PROTECTION ASSEMBLY

(71) Applicant: CYG WAYON CIRCUIT PROTECTION CO., LTD., Shanghai (CN)

(72) Inventors: Quanquan Yang, Shanghai (CN); Yutang Liu, Shanghai (CN); Rong Fan, Shanghai (CN); Yong Fang, Shanghai (CN); Guochen Wu, Shanghai (CN)

(73) Assignee: CYG WAYON CIRCUIT PROTECTION CO., LTD., Shanghai (CN)

( * ) Notice: Subject to any disclaimer, the term of this patent is extended or adjusted under 35 U.S.C. 154(b) by 0 days.

(21) Appl. No.: 16/341,483

(22) PCT Filed: Dec. 16, 2016

(86) PCT No.: PCT/CN2016/110342
§ 371 (c)(1),
(2) Date: Apr. 12, 2019

(87) PCT Pub. No.: WO2018/072292
PCT Pub. Date: Apr. 26, 2018

(65) Prior Publication Data
US 2019/0306970 A1 Oct. 3, 2019

(30) Foreign Application Priority Data

Oct. 17, 2016 (CN) .......................... 2016 1 0903796

(51) Int. Cl.
*H05K 1/02* (2006.01)
*H01C 7/02* (2006.01)
*H01C 7/13* (2006.01)

(52) U.S. Cl.
CPC ........... *H05K 1/0254* (2013.01); *H01C 7/027* (2013.01); *H01C 7/13* (2013.01); *H05K 1/0213* (2013.01)

(58) Field of Classification Search
CPC ......... H01C 7/027; H01C 7/13; H05K 1/0254
See application file for complete search history.

(56) References Cited

U.S. PATENT DOCUMENTS

| 7,701,322 B2* | 4/2010 | Wang | ..................... | H01C 7/021 |
| | | | | 338/22 R |
| 8,502,638 B1* | 8/2013 | Sha | ........................ | H01C 7/008 |
| | | | | 338/13 |

(Continued)

FOREIGN PATENT DOCUMENTS

| CN | 101000817 | 7/2007 |
| CN | 105869806 | 8/2016 |

OTHER PUBLICATIONS

CN 105869806, Fang et al., machine translation of Description and Claims. (Year: 2016).*

*Primary Examiner* — Kyung S Lee
(74) *Attorney, Agent, or Firm* — Ware, Fressola, Maguire & Barber LLP

(57) ABSTRACT

A circuit protection assembly has a protection element having a positive temperature coefficient of resistance and consisting of a polymer-based conductive composite material layer tightly clamped and fixed between two metal electrodes and a copper clad laminate having a through hole in a middle thereof, wherein the protection element is provided in the through hole, the copper clad laminate serves as a substrate for the circuit protection assembly and has an adhesive layer on an upper surface and a lower surface thereof, so as to cover the protection element in a space formed by the copper clad laminate and the upper and the lower adhesive layers. The protection element having a (Continued)

positive temperature coefficient of resistance is electrically connected to a protected circuit via a conductive part.

9 Claims, 1 Drawing Sheet

(56) References Cited

U.S. PATENT DOCUMENTS

| | | | | |
|---|---|---|---|---|
| 8,830,027 | B2* | 9/2014 | Sha | H01C 1/084 |
| | | | | 338/22 R |
| 8,933,775 | B2* | 1/2015 | Wang | H01C 1/08 |
| | | | | 338/13 |
| 2002/0130757 | A1* | 9/2002 | Huang | H01C 1/1406 |
| | | | | 338/22 R |
| 2007/0146112 | A1* | 6/2007 | Wang | H01C 1/1406 |
| | | | | 338/22 R |
| 2010/0134942 | A1* | 6/2010 | Wang | H01C 1/1406 |
| | | | | 361/93.7 |
| 2013/0187748 | A1* | 7/2013 | Sha | H01C 1/084 |
| | | | | 338/22 R |
| 2014/0146432 | A1* | 5/2014 | Wang | H01C 7/021 |
| | | | | 361/93.7 |

* cited by examiner

CIRCUIT PROTECTION ASSEMBLY

TECHNICAL FIELD

The present invention relates to a circuit protection assembly and, more particularly, to a circuit protection assembly that has a protective element with positive temperature coefficient (PTC) of resistance embedded in a circuit protective component in the copper clad laminate to save installation space of circuit protection elements.

BACKGROUND OF THE INVENTION

The resistance of polymer-based conductive composite material remains extremely low at room temperature and is sensitive to temperature change. In other word, the resistance will instantly increase to thousand times to open-circuit conditions when the temperature reaches a critical temperature or the circuit has over current, so as to protect circuit.

With the development of intelligent mobile terminals, the development trend of electronic elements is miniaturization with high holding current. However, the performance of traditional circuit protection components mounted on the surface of the circuit board is so difficult to improve further due to the space limitation of battery pack. If the PTC over-current protection device is embedded into the copper clad laminate, which can not only greatly reduce the limitation on circuit protection element thickness, but also provide more design space to the PTC element. Moreover, the PTC elements are sealed in the copper clad laminate, which greatly reduces negative impact on PTC elements from the external environment, so the circuit protection assembly has an excellent environmental reliability.

SUMMARY OF THE INVENTION

The present invention relates to a circuit protection assembly, which can not only save installation space of circuit protection elements, but also have an excellent environmental reliability.

The present invention relates to a circuit protection assembly, comprising: a protection element with PTC of resistance consists of a polymer-based conductive composite layer tightly clamped and fixed between two metal electrode plates (a) The copper clad laminate which has a through hole in a middle thereof, and wherein the protection element is provided in the through hole.

(b) Conductive parts are used to connect protection element with the protected circuit electrically.

(c) The polymer-based conductive composite material is made by at least one polymer filled by at least one conductive filler which has a resistivity less than 100 μΩ·cm. And the diameter of conductive filler is 0.1 μm~50 μm.

Placing the protection element inside the copper clad laminate that can not only greatly reduce the limitation on the thickness of circuit protection element, but also improve environmental reliability of the circuit protection assembly because of reducing impact on PTC elements from the external environment.

According to the scheme presented above, the structure of copper clad laminate as mentioned above is a single-layer, double-layer or multi-layer laminate and the copper clad laminate is laminated with copper foil above and below a substrate by adhesive layer. The substrate is papery substrate, glass fiber fabric substrate, paper and glass fiber fabric composite substrate or ceramic substrate.

According to the scheme presented above, the adhesive layer as mentioned above is one of phenolic resin, epoxy resin, polyester resin, bismaleimide-triazine resin, polyimide resin, polyphenylene ether, styrene-maleic anhydride copolymers, polycyanate ester resin, polyolefin resin and mixtures thereof.

According to the scheme presented above, the polymer as mentioned above is polythene, chlorinated polyethylene, oxidized polyethylene, polyvinyl chloride, butadiene-acrylonitrile copolymer, acrylonitrile-butadiene-styrene copolymer, polystyrene, polycarbonate, polyamide, polyimide, polyethylene terephthalate, polybutylene terephthalate, polyphenylene oxide, polyphenylene sulfide, polyoxymethylene, polytetrafluoroethylene, phenolic resin, ethylene, Fluorinated ethylene propylene, polyvinyl fluoride, maleic anhydride grafted polyethylene, polypropylene, polyvinylidene fluoride, epoxy resin, ethylene-vinyl acetate copolymer, polymethyl-methacrylate, ethylene-acrylic acid copolymer and mixtures thereof.

According to the scheme presented above, the conductive filler powder as mentioned above is selected from one kind of or the mixture of conductive carbons, metals, conductive ceramics.

According to the scheme presented above, the conductive carbon as mentioned above is carbon black, carbon fiber, carbon nanotube, graphite, grapheme and mixtures thereof.

According to the scheme presented above, the metal power as mentioned above is selected from copper, nickel, cobalt, iron, tungsten, tin, lead, silver, gold, platinum and their alloy.

According to the scheme presented above, the conductive ceramic power as mentioned above is one kind of or mixtures of metal nitride, metal carbide, metal boride, metal silicide and layered ceramic powders.

According to the scheme presented above, the metal boride as mentioned above is one kind of or mixtures of tantalum boride, tantalum diboride, vanadium boride, vanadium diboride, zirconium diboride, titanium diboride, niobium boride, niobium diboride, molybdenum boride ($Mo_2B$), molybdenum pentaboride ($Mo_2B_5$), hafnium diboride, tungsten boride, ditungsten boride, chromium boride, dichromium boride ($Cr_2B$), chromium diboride or chromium triboride ($Cr_5B_3$).

According to the scheme presented above, the metal nitride as mentioned above is one kind of or mixtures of tantalum nitride, vanadium nitride, zirconium nitride, titanium nitride, niobium nitride or hafnium nitride.

According to the scheme presented above, the metal carbide as mentioned above is one kind of or mixtures of tantalum carbide, vanadium carbide, zirconium carbide, titanium carbide, niobium carbide, molybdenum carbide, ($Mo_2C$), hafnium carbide, tungsten monocarbide, ditungsten carbide or trichromiunm dicarbide ($Cr_3C_2$)

According to the scheme presented above, the silicide as mentioned above is one kind of or mixtures of tantalum disilicide, tantalum silicide ($Ta_5Si_3$), trivanadium silicide, vanadium disilicide, zirconium disilicide, titanium disilicde, titanium silicide ($Ti_5Si_3$), niobium disilicide, molybdenum disilicide, hafnium disilicide, tungsten disilicide, trichromium silicide ($Cr_3Si$) or chromium disilicide.

According to the scheme presented above, the layered ceramic powder as mentioned above is one kind of or mixtures of $Sc_2InC$, $Ti_2AlC$, $Ti_2GaC$, $Ti_2InC$, $Ti_2TlC$, $V_2AlC$, $V_2GaC$, $Cr_2GaC$, $Ti_2AlN$, $Ti_2GaN$, $Ti_2InN$, $V_2GaN$, $Cr_2GaN$, $Ti_2GeC$, $Ti_2SnC$, $Ti_2PbC$, $V_2GeC$, $Cr_2SiC$, $Cr_2GeC$, $V_2PC$, $V_2AsC$, $Ti_2SC$, $Zr_2InC$, $Zr_2TlC$, $Nb_2AlC$, $Nb_2GaC$, $Nb_2InC$, $Mo_2GaC$, $Zr_2InN$, $Zr_2TlN$, $Zr_2SnC$, $Zr_2PbC$, $Nb_2SnC$, $Nb_2PC$, $Nb_2AsC$, $Zr_2SC$, $Nb_2SC$, $Hf_2SC$, $Hf_2InC$, $Hf_2TlC$, $Ta_2AlC$, $Ta_2GaC$, $Hf_2SnC$, $Hf_2PbC$, $Hf_2SnN$, $Ti_3AlC_2$, $V_3AlC_2$, $Ta_3AlC_2$, $Ti_3SiC_2$, $Ti_3GeC_2$, $Ti_3SnC_2$, $Ti_4AlN_3$, $V_4AlC_3$, $Ti_4GaC_3$, $Nb_4AlN_3$, $Ta_4AlC_3$, $Ti_4SiC_3$, $Ti_4GeC_3$ According to the scheme presented above, the conductive parts as mentioned above are used to connect the PTC protective element in series with the protected circuit to form a galvanic circle.

According to the scheme presented above, the conductive parts as mentioned above is selected from one of metal nickel, copper, aluminum, zinc, tin, bismuth, indium, silver, gold and their alloy. The shape of conductive part can be point, line, strap, lamellar, column, full round hole, half round hole, arc hole or blind hole According to the scheme presented above, the outer surface of copper clad laminate is covered with insulating paint to prevent other components from electrical contact with external lines, and an identifier can print on insulating paint.

The advantage of the invention lies in the fact that the circuit protection element is embedded into the copper clad laminate, which can not only greatly reduce the limitation on circuit protection element thickness, but also provide more design space to the circuit protection element. Moreover, the circuit protection elements are sealed in the copper clad laminate, which greatly reduces negative impact on PTC elements from the external environment, so the circuit protection assembly has an excellent environmental reliability.

REFERENCE NUMERALS IN THE DRAWINGS

100, 200, 300, 400—Protection Element.
110a, 210a, 310a, 410a—Lower Metal Electrode Plate.
110b, 210b, 310b, 410b—Upper Metal Electrode Plate
120, 220, 320, 420—Polymer-based Conductive Composites
  231a, 331a, 431a—Lower Insulation Coating.
  231b, 331b, 431b—Upper Insulation Coating.
  232, 332, 432—Copper Clad Laminate
  233a, 333a, 433a—Lower Adhesive Layer.
  233b, 333b, 433b—Upper Adhesive Layer.
  240a, 340a, 440a—Conductive Part No. 1.
  240b, 340b, 440b—Conductive Part No. 2.
  440c—Conductive Part No. 3.
  250a—Lower Copper Foil.
  250b—Upper Copper Foil.
  350a, 350b—Left Copper Foil, Right Copper Foil;
  450a, 450b—Upper Left Copper Foil, Upper Right Copper Foil.
  450c—Lower Copper Foil.

DETAILED DESCRIPTION OF THE INVENTION

1. Material Preparation

Circuit Protection Element with Positive Temperature Coefficient of Resistance:

In the preparation, the invention precisely weights the polymer and conductive filler according to the formula. Setting the internal mixer at a temperature of 180° C. and a speed of 30 turns per minute, putting the polymer in the mixer for mixing 3 minutes, and then adding the conductive filler to go on mixing 15 minutes, finally the polymer-based conductive composite material will be finished.

Figure 1:
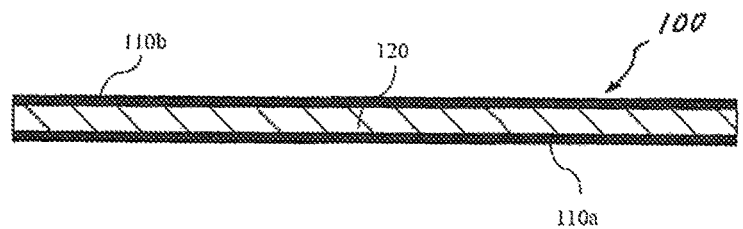
FIG. 1 shows the schematic diagram of protection element with PTC of Resistance according to the present invention.

The polymer-based conductive composite material with positive temperature coefficient (PTC) of resistance which is melted and mixed above, is flattened by a mill to achieve the polymer-based composite material 120 with thickness 0.2~0.25 mm. The protective element 100 with positive temperature coefficient of resistance is shown in FIG. 1.

Material 120 is disposed between two symmetric electrode plates 110a and 110b, and the rough surfaces of metal electrode plates 110a and 110b are tightly connected with the polymer-based conductive composite material 120 through thermo-compression bonding. The temperature of thermo-compression bonding is at 180° C. to hot press with the pressure at 12 Mpa for 10 minutes and then cold press it 10 minutes in the cold press machine. The sheet of PTC is obtained.

The sheet of PTC is punched or sliced to make a protective element 100 with suitable size.

2. Circuit Protection Assembly (a) The copper clad laminate which has a through hole in a middle thereof to dispose the protection element.

(b) Conductive parts are electrically connected to the protection element with the protected circuit.

(c) The polymer-based conductive composite material made by at least one polymer is filled by at least one conductive filler which has a resistivity less than 100 μΩ·cm, with a diameter of conductive filler being 0.1 μm~50 μm.

The conductive parts as mentioned above is selected from one of metal nickel, copper, aluminum, zinc, tin, bismuth, indium, silver, gold and their alloy. The shape of conductive part can be point, line, strap, lamellar, column, full round hole, half round hole, arc hole or blind hole.

Implement No. 1

Figure 2:
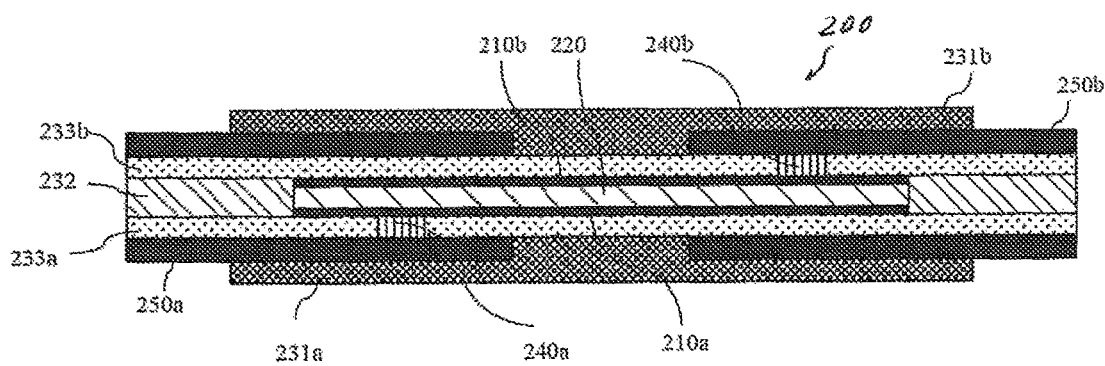
FIG. 2 shows a sectional structure diagram of the implementation No. 1.

As shown in FIG. 2: the circuit protection assembly is composed of copper foil laminate, protective elements with positive temperature coefficient of resistance and conductive components. The protection element 200 which has the same or similar structure and performance with protection element 100 is placed in the through hole of the copper clad laminate 232. The protection element has sandwich structure consisting of the upper metal electrode plate 210a and the lower metal electrode plate 210b with the polymer-based conductive composite 220 placed therebetween. The upper prepreg adhesive layer 233b and the lower prepreg adhesive layer 233a are hot-pressed on the upper and lower surfaces of the laminate 232. The upper copper foil 250b and the lower copper foil 250a are respectively adhered to the upper prepreg layer 233b and lower prepreg layer 233a during hot-pressing. The upper metal electrode plate 210b is electrically connected to the upper copper foil 250*b* by conductive part 240*b*. The lower metal electrode plate 210*a* is electrically connected to the lower copper foil 250*a* by conductive part 240*a*. The lower copper foil 250*a* and the upper copper foil 250*b* can be processed into various shapes of external circuit. The outer surface of copper clad laminate is covered with insulating paint to form upper and lower insulation coating 231*b* and 231*a* respectively to prevent other components from electrical contact with external lines, and an identifier can print on insulating paint.

Implement No. 2

Figure 3:
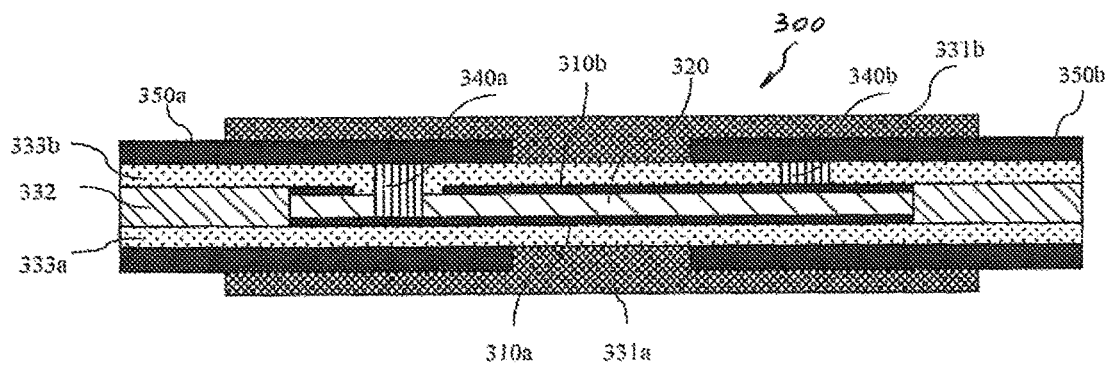
FIG. 3 shows a sectional structure diagram of the implementation No. 2.

As shown in FIG. 3: the circuit protection assembly is composed of copper foil laminate, protective elements 300 with positive temperature coefficient of resistance and conductive components. The protection element 300 which has the same or similar structure and performance with protection element 100 is placed in the through hole of the copper clad laminate 332. The protection element has sandwich structure consisting of the upper metal electrode plate 310*a* and the lower metal electrode plate 310*b* with the polymer-based conductive composite 320 placed in the middle. The upper prepreg adhesive layer 333*b* and the lower prepreg adhesive layer 333*a* are hot-pressed on the upper and lower surfaces of the laminate 332. The upper copper foil 350*b* and the lower copper foil 350*a* are respectively adhered to the upper prepreg layer 333*b* and lower prepreg layer 333*a* during hot-pressing. Then the right copper foil 350*a* and left copper foil 350*b* are formed from the copper foils 350*a* and 350*b* by etching. The upper metal electrode plate 310*b* is electrically connected to the copper foil 350*b* on the right by conductive part 340*b*.

The right copper foil 350*a* and the left copper foil 350*b* can be processed into various shapes of external circuit. The lower metal electrode plate 310*a* is electrically connected to the copper foil 350*a* on the right by conductive part 340*a*. The outer surface of copper clad laminate is covered with insulating paint to form upper and lower insulation coating 331*b* and 331*a* respectively to prevent other components from electrical contact with external lines, and an identifier can print on insulating paint.

Implement No. 3

Figure 4:
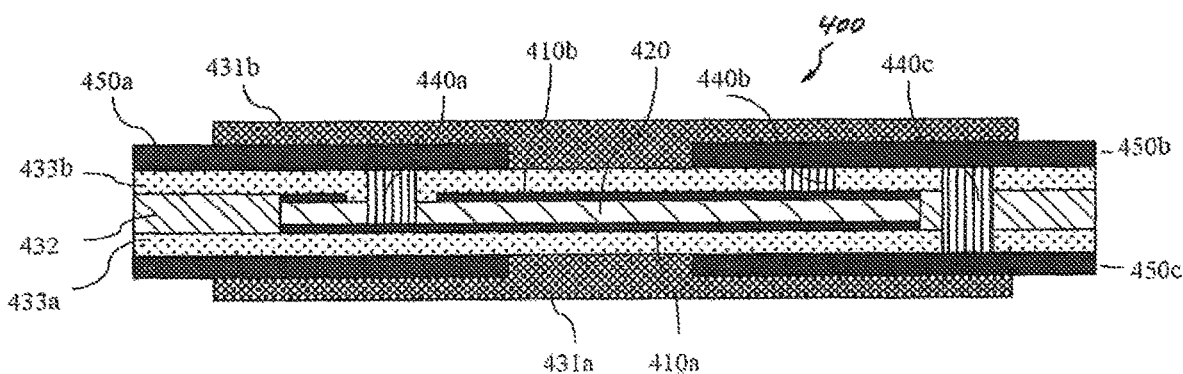
FIG. 4 shows a sectional structure diagram of the implementation No. 3.

As shown in FIG. 4: the circuit protection assembly is composed of copper foil laminate, protective elements 400 with positive temperature coefficient of resistance and conductive components. The protection element 400 which has the same or similar structure and performance with protection element 100 is placed in the through hole of the copper clad laminate 432. The protection element has sandwich structure consisting of the upper metal electrode plate 410*a* and the lower metal electrode plate 410*b* with the polymer-based conductive composite 420 placed in the middle. The upper prepreg adhesive layer 433*b* and the lower prepreg adhesive layer 433*a* are hot-pressed on the upper and lower surfaces of the laminate 432. The upper copper foil 450*b* and the lower copper foil 450*a* are respectively adhered to the upper prepreg layer 433*b* and lower prepreg layer 433*a* during hot-pressing. Then the upper right foil 450*a*, upper left foil 450*b* and lower copper foil 450*c* are formed from the copper foil by etching. The upper metal electrode plate 410*b* is electrically connected to the upper right copper foil 450*b* by conductive part 440*b*, then the lower copper foil 450*c* is electrically connected to the upper right foil 450*b* by conductive part 440*c*. The lower metal electrode plate 410*a* is electrically connected to the upper left copper foil 450*a* by conductive part 440*a*. The copper foils 450*a*, 450*b* and 450*c* can be processed into various shapes of external circuit. The outer surface of copper clad laminate is covered with insulating paint to form upper and lower insulation coating 431*b* and 431*a* respectively to prevent other components from electrical contact with external lines, and an identifier can print on insulating paint.

The present invention's characteristics and contents are explained as above, but the explanation is still limited or just refers to some particular part, the invention's characteristics maybe will more than the contents that are illustrated in the paper. Therefore, the invention's protective range will not be limited in the contents of the implementation part, but should include the combination of all the contents that showed in different part, and the various of replacement and embellishment that accord with the invention, which is covered by claims of the invention.

What is claimed is:

1. A circuit protection assembly, comprising a protection element with a positive temperature coefficient (PTC) of resistance, the protection element comprising a polymer-based conductive composite layer securely clamped and fixed between two metal electrode plates, the circuit protection assembly further comprising
    a copper clad laminate having a through hole dimensioned for placing the protection element therein; and
    conductive parts electrically connected to the metal electrode plates of the protection element, wherein the polymer-based conductive composite layer is made of at least one polymer filled by at least one conductive filler which has a resistivity less than 100μΩ-cm and the conductive filler has a diameter of 0.1 μm~50 μm, wherein the conductive parts are connected to the protection element in series with a protected circuit to form a galvanic loop, wherein the conductive part is selected from one of metal nickel, copper, aluminum, zinc, tin, bismuth, indium, silver, gold and their alloy, and the conductive part can be shaped as a point, line, strap, lamellar, column, full round hole, half round hole, arc hole or blind hole, and the copper clad laminate has outer surfaces covered with insulating paint, wherein the protection element provided in the through hole of the copper clad laminate has a sandwich structure consisting of the polymer-based conductive composite layer secured between the two metal electrode plates, the copper clad laminate having a lower laminate surface and an upper laminate surface, the two metal electrode plates having a lower electrode plate and an upper electrode plate, the conductive parts having a first conductive part and a second conductive part, wherein the circuit protection assembly further comprises
    a lower prepreg adhesive layer hot-pressed on the lower laminate surface,
    an upper prepreg adhesive layer hot-pressed on the upper laminate surface,
    a lower copper foil arranged to adhere to the lower prepreg adhesive layer during hot pressing, the lower copper foil electrically connected to the lower metal plate by the first conductive part, and
    an upper copper foil arranged to adhere to the upper prepreg adhesive layer during hot pressing, the upper copper foil electrically connected to the upper metal plate by the second conductive part, and wherein the lower and upper copper foils can be processed into various shapes of an external circuit.

2. The circuit protection assembly according to claim 1, wherein the copper clad laminate is a single-layer, double-layer or multi-layer laminate and the copper clad laminate is laminated with copper foil above and below a substrate by adhesive layer and wherein the substrate is papery substrate, glass fiber fabric substrate, paper and glass fiber fabric composite substrate or ceramic substrate.

3. The circuit protection assembly according to claim 1, wherein the adhesive layer is one of phenolic resin, epoxy resin, polyester resin, bismaleimide-triazine resin, polyimide resin, polyphenylene ether, styrene-maleic anhydride copolymers, polycyanate ester resin, polyolefin resin and mixtures thereof.

4. The circuit protection assembly according to claim 1, wherein the polymer based material is polythene, chlorinated polyethylene, oxidized polyethylene, polyvinyl chloride, butadiene-acrylonitrile copolymer, acrylonitrile-butadiene-styrene copolymer, polystyrene, polycarbonate, polyamide, polyimide, polyethylene terephthalate, polybutylene terephthalate, polyphenylene oxide, polyphenylene sulfide, polyoxymethylene, polytetrafluoroethylene, phenolic resin, ethylene, Fluorinated ethylene propylene, polyvinyl fluoride, maleic anhydride grafted polyethylene, polypropylene, polyvinylidene fluoride, epoxy resin, ethylene-vinyl acetate copolymer, polymethyl-methacrylate, ethylene-acrylic acid copolymer and mixtures thereof.

5. The circuit protection assembly according to claim 1, wherein the conductive filler is selected from one kind of or the mixture of conductive carbons, metals, conductive ceramics.

6. The circuit protection assembly according to claim 5, wherein the conductive ceramic powder is one kind of mixtures of metal nitride, metal carbide, metal boride, metal silicide and layered ceramic powders.

7. The circuit protection assembly according to claim 6, wherein the layered ceramic powder is $Sc_2InC$, $Ti_2AlC$, $Ti_2GaC$, $Ti_2InC$, $Ti_2TlC$, $V_2AlC$, $V_2GaC$, $Cr_2GaC$, $Ti_2AlN$, $Ti_2GaN$, $Ti_2InN$, $V_2GaN$, $Cr_2GaN$, $Ti_2GeC$, $Ti_2SnC$, $Ti_2PbC$, $V_2GeC$, $Cr_2SiC$, $Cr_2GeC$, $V_2PC$, $V_2AsC$, $Ti_2SC$, $Zr_2InC$, $Zr_2TlC$, $Nb_2AlC$, $Nb_2GaC$, $Nb_2InC$, $Mo_2GaC$, $Zr_2InN$, $Zr_2TlN$, $Zr_2SnC$, $Zr_2PbC$, $Nb_2SnC$, $Nb_2PC$, $Nb_2AsC$, $Zr_2SC$, $Nb_2SC$, $Hf_2SC$, $Hf_2InC$, $Hf_2TlC$, $Ta_2AlC$, $Ta_2GaC$, $Hf_2SnC$, $Hf_2PbC$, $Hf_2SnN$, $Ti_3AlC_2$, $V_3AlC_2$, $Ta_3AlC_2$, $Ti_3SiC_2$, $Ti_3GeC_2$, $Ti_3SnC_2$, $Ti_4AlN_3$, $V_4AlC_3$, $Ti_4GaC_3$, $Nb_4AlN_3$, $Ta_4AlC_3$, $Ti_4SiC_3$, $Ti_4GeC_3$ and mixtures thereof.

8. A circuit protection assembly, comprising a protection element with a positive temperature coefficient (PTC) of resistance, the protection element comprising a polymer-based conductive composite layer securely clamped and fixed between two metal electrode plates, the circuit protection assembly further comprising
a copper clad laminate having a through hole dimensioned for placing the protection element therein; and
conductive parts electrically connected to the metal electrode plates of the protection element, wherein the polymer-based conductive composite layer is made of at least one polymer filled by at least one conductive filler which has a resistivity less than 100μΩ-cm and the conductive filler has a diameter of 0.1 μm~50 μm, wherein the conductive parts are connected to the protection element in series with a protected circuit to form a galvanic loop, wherein the conductive part is selected from one of metal nickel, copper, aluminum, zinc, tin, bismuth, indium, silver, gold and their alloy, and the conductive part can be shaped as a point, line, strap, lamellar, column, full round hole, half round hole, arc hole or blind hole, and the copper clad laminate has outer surfaces covered with insulating paint, wherein the protection element provided in the through hole of the copper clad laminate has a sandwich structure consisting of the polymer-based conductive composite layer secured between the two metal electrode plates, the copper clad laminate having a lower laminate surface and an upper laminate surface, the two metal electrode plates having a lower electrode plate and an upper electrode plate, the conductive parts having a first conductive part and a second conductive part, wherein the circuit protection assembly further comprises
a lower prepreg adhesive layer hot-pressed on the lower laminate surface,
an upper prepreg adhesive layer hot-pressed on the upper laminate surface,
a lower copper foil arranged to adhere to the lower prepreg adhesive layer during hot pressing, and
an upper copper foil arranged to adhere to the upper prepreg adhesive layer during hot pressing, wherein the upper copper foil has a right copper foil part and a left copper foil part, the left copper foil part electrically connected to the lower metal plate by the first conductive part, and the right copper foil part electrically connected to the upper metal plate by the second conductive part.

9. A circuit protection assembly, comprising a protection element with a positive temperature coefficient (PTC) of resistance, the protection element comprising a polymer-based conductive composite layer securely clamped and fixed between two metal electrode plates, the circuit protection assembly further comprising
a copper clad laminate having a through hole dimensioned for placing the protection element therein; and
conductive parts electrically connected to the metal electrode plates of the protection element, wherein the polymer-based conductive composite layer is made of at least one polymer filled by at least one conductive filler which has a resistivity less than 100μΩ-cm and the conductive filler is has a diameter of 0.1 μm~50 μm, wherein the conductive parts are connected to the protection element in series with a protected circuit to form a galvanic loop, wherein the conductive part is selected from one of metal nickel, copper, aluminum, zinc, tin, bismuth, indium, silver, gold and their alloy, and the conductive part can be shaped as a point, line, strap, lamellar, column, full round hole, half round hole, arc hole or blind hole, and the copper clad laminate has outer surfaces covered with insulating paint, wherein the protection element provided in the through hole of the copper clad laminate has a sandwich structure consisting of the polymer-based conductive composite layer secured between the two metal electrode plates, the copper clad laminate having a lower laminate surface and an upper laminate surface, the two metal electrode plates having a lower electrode plate and an upper electrode plate, the conductive parts having a first conductive part, a second conductive part and a third conductive part, wherein the circuit protection assembly further comprises
a lower prepreg adhesive layer hot-pressed on the lower laminate surface,
an upper prepreg adhesive layer hot-pressed on the upper laminate surface,
a lower copper foil arranged to adhere to the lower prepreg adhesive layer during hot pressing, and
an upper copper foil arranged to adhere to the upper prepreg adhesive layer during hot pressing, wherein the upper copper foil has a right copper part and a left copper foil part, the left copper foil part electrically connected to the lower metal plate by the first conductive part, the right copper foil part electrically connected to the upper metal plate by the second conductive part, the right copper foil part electrically connected to the lower copper foil by the third conductive part.

\* \* \* \* \*